US011018468B2

(12) United States Patent
Huang

(10) Patent No.: US 11,018,468 B2
(45) Date of Patent: May 25, 2021

(54) CARD TRAY, CARD TRAY PLUG-IN DEVICE, AND TERMINAL

(71) Applicant: Guangdong OPPO Mobile Telecommunications Corp., Ltd., Guangdong (CN)

(72) Inventor: Hanjie Huang, Guangdong (CN)

(73) Assignee: GUANGDONG OPPO MOBILE TELECOMMUNICATIONS CORP., LTD., Dongguan (CN)

(*) Notice: Subject to any disclaimer, the term of this patent is extended or adjusted under 35 U.S.C. 154(b) by 0 days.

(21) Appl. No.: 16/654,651

(22) Filed: Oct. 16, 2019

(65) Prior Publication Data
US 2020/0044402 A1 Feb. 6, 2020

Related U.S. Application Data

(63) Continuation of application No. PCT/CN2017/081154, filed on Apr. 19, 2017.

(51) Int. Cl.
*H01R 24/00* (2011.01)
*H01R 33/88* (2006.01)
(Continued)

(52) U.S. Cl.
CPC ........... *H01R 33/88* (2013.01); *H01R 12/714* (2013.01); *H01R 13/6273* (2013.01);
(Continued)

(58) Field of Classification Search
CPC .. H01R 33/88; H01R 12/714; H01R 13/6273; H01R 33/94; H01R 33/97; H01R 13/24;
(Continued)

(56) References Cited

U.S. PATENT DOCUMENTS 9,954,328 B2 * 4/2018 Motohashi ........... H01R 12/721
2012/0258630 A1 10/2012 Takao
(Continued)

FOREIGN PATENT DOCUMENTS

CN 203826714 U 9/2014
CN 203982355 U 12/2014
(Continued)

OTHER PUBLICATIONS

International search report issued in corresponding international application No. PCT/CN2017/081154 dated Jan. 22, 2018.
(Continued)

*Primary Examiner* — Abdullah A Riyami
*Assistant Examiner* — Nelson R. Burgos-Guntin

(57) ABSTRACT

The present disclosure provides a card tray, a card tray plug-in device, and a terminal. The card tray may include a first supporting portion and a second supporting portion connected with the first supporting portion. The first and the second supporting portions may both be configured for placing data cards, and configured on a same side of the card tray along a thickness direction of the card tray. The card tray may include an electrical connection portion, a data card supported on the first supporting portion and/or another data card supported on the second supporting portion may electrically connect with a card holder of a terminal through the electrical connection portion.

20 Claims, 6 Drawing Sheets

(51) Int. Cl.
  *H04B 1/3818* (2015.01)
  *H01R 12/71* (2011.01)
  *H01R 13/627* (2006.01)
  *H01R 33/94* (2006.01)
  *H01R 33/97* (2006.01)
  *H04M 1/02* (2006.01)
  *H05K 5/02* (2006.01)
  *H01R 13/24* (2006.01)

(52) U.S. Cl.
  CPC ............ *H01R 33/94* (2013.01); *H01R 33/97* (2013.01); *H04B 1/3818* (2015.01); *H04M 1/026* (2013.01); *H05K 5/0291* (2013.01); *H01R 13/24* (2013.01)

(58) Field of Classification Search
  CPC ..... H01R 12/71; H04B 1/3818; H04M 1/026; H04M 1/02; H05K 5/0291; G06K 13/08; G06K 19/07741
  USPC .......................... 439/159, 630, 160, 737, 326
  See application file for complete search history.

(56) References Cited

U.S. PATENT DOCUMENTS

| | | |
|---|---|---|
| 2015/0004846 A1 | 1/2015 | Cao et al. |
| 2016/0006173 A1 | 1/2016 | Wang et al. |
| 2016/0111802 A1* | 4/2016 | Shimotsu ............ H01R 13/633 439/159 |
| 2016/0248184 A1* | 8/2016 | Motohashi ............ G06K 13/08 |
| 2016/0359269 A1* | 12/2016 | Motohashi ............ G06K 13/08 |
| 2017/0162982 A1* | 6/2017 | Wu ...................... H04B 1/3816 |
| 2017/0179659 A1* | 6/2017 | Motohashi ............. H01R 27/00 |
| 2018/0330215 A1* | 11/2018 | Zeng ..................... H05K 5/0091 |
| 2019/0281714 A1* | 9/2019 | Yao ....................... H05K 5/0295 |
| 2020/0044402 A1* | 2/2020 | Huang ................. H05K 5/0291 |
| 2020/0195288 A1* | 6/2020 | Wang ..................... H01R 13/02 |

FOREIGN PATENT DOCUMENTS

| | | |
|---|---|---|
| CN | 204349141 U | 5/2015 |
| CN | 105763686 A | 7/2016 |
| CN | 206022679 U | 3/2017 |
| FR | 2771199 A1 | 5/1999 |
| WO | 2016015269 A1 | 2/2016 |

OTHER PUBLICATIONS

European search report, EP17906601, dated Jan. 22, 2020 (8 pages).
English translation of Chinese First Office Action and Written Opinion for related Chinese application No. 201780087063.7, dated May 6, 2020 (14 pages).
Chinese Second Office Action with English Translation for Chinese Application No. 201780087063.7, dated Feb. 3, 2021 (11 pages).

* cited by examiner

US 11,018,468 B2

CARD TRAY, CARD TRAY PLUG-IN DEVICE, AND TERMINAL

CROSS-REFERENCE TO RELATED APPLICATION(S)

The present application is a continuation application of International (PCT) Patent Application No. PCT/CN2017/081154 filed on Apr. 19, 2017, the entire contents of which are hereby incorporated by reference in their entireties.

TECHNICAL FIELD

The present disclosure relates to the field of electronic devices, particularly to a card tray, a card tray plug-in device, and a terminal.

BACKGROUND

As one of the most important technologies in the world, terminals has been involved in everyone's life and has become indispensable for human daily life and working. A terminal may be configured with a subscriber identification module (SIM) card, a trans-flash (TF) card, a micro secure digital (MICROSD) card or any other data card to make calls, store personal information, images and videos, and perform other like functions. In the related art, a top side and a bottom side of a card tray may both be configured for placing data cards, such that thickness of the entire card tray may be increased, which may result in a thicker terminal and poor user experience.

SUMMARY

According to an aspect of the present disclosure, a card tray may be provided to include a first supporting portion; and a second supporting portion connected to the first supporting portion. The first supporting portion may be configured to support a first data card, the second supporting portion may be configured to support a second data card; and the first supporting portion and the second supporting portion may be provided on a same side of the card tray along a thickness direction of the card tray. The card tray may be provided with an electrical connection portion, and the first data card supported on the first supporting portion and the second data card supported on the second supporting portion electrically connect with a card holder of a terminal through the electrical connection portion.

According to another aspect of the present disclosure, a card tray plug-in device may be provided to include a card tray, wherein the card tray may include a base having a top surface and a bottom surface opposite to the top surface along a thickness direction of the base, the base defining a first recess and a second recess, the first and the second recesses recessing from the top surface to the bottom surface, wherein projections of the first recess and the second recess on the bottom surface may be unoverlapped; a first data card received in the first recess, a second data card received in the second recess; a second data card received in the second recess; first contact terminals received in the first recess and configured to contact with the first data card; second contact terminals received in the second recess and configured to contact with the second data card; and a card holder configured to receive the card tray and comprising signal terminals connected to the connection terminals.

According to still another aspect of the present disclosure, a terminal may be provided to include an enclosure having a chamber and defining a hole communicated with the chamber; a card holder received in the chamber; a card tray received in the chamber and capable of moving via the hole from a first state where at least part of the card tray may be out of the chamber to a second state where the card tray is received in the chamber, wherein the card tray may include a base having a top surface and a bottom surface opposite to the top surface, contact terminals mounted on the top surface of the base, connection terminals mounted on one end of the base and connecting with the contact terminals, and a cap mounted on the other end of the base and engaged in the hole of the enclosure; a first data card supported on the top surface of the base and connected to the contact terminals; and a second data card supported on the top surface of the base and connected to the contact terminals, wherein projections of the first and second data cards on the bottom surface of the base are totally separated.

BRIEF DESCRIPTION OF DRAWINGS

The above-described and/or additional aspects and advantages of the present disclosure may become obvious and be easy to understand by referring to following descriptions of embodiments in accordance with appended figures.

Figure 1:
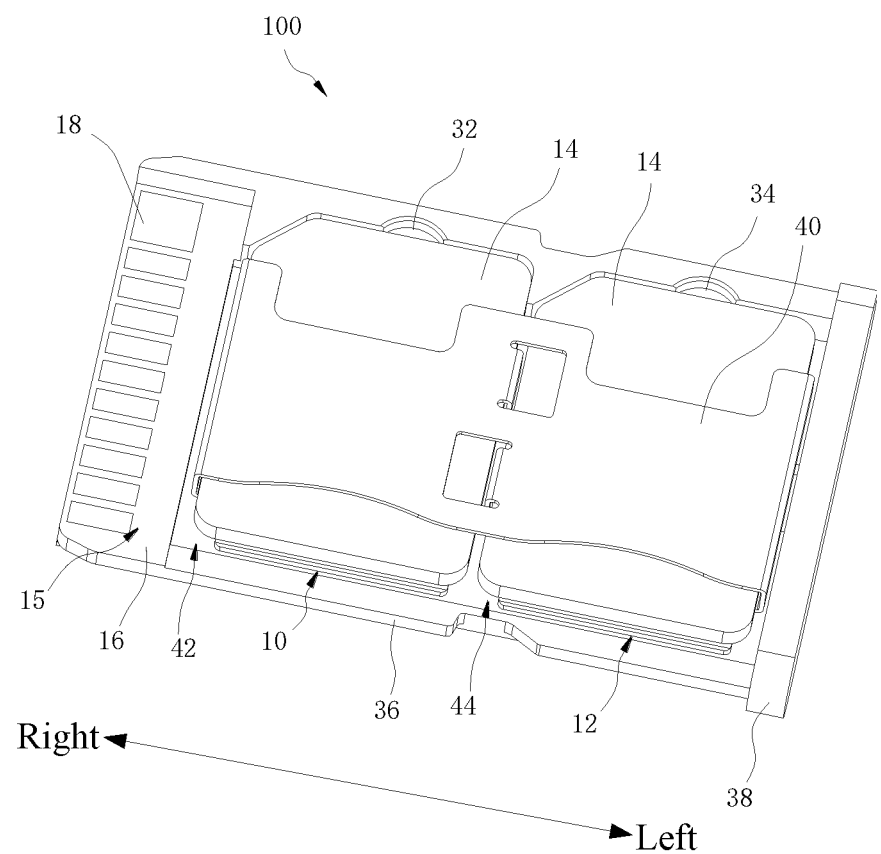
FIG. 1 is a perspective view of a card tray provided by an embodiment of the present disclosure.

Elements characters are illustrated as a card tray 100, a first supporting portion 10, a second supporting portion 12, a data card 14, an electrical connection portion 15, an insertion section 16, a connection terminal 18, a first receiving groove 20, a second receiving groove 22, a first contact terminal 24, a second contact terminal 26, a first mount 28, a second base 30, a first picking groove 32, a second picking groove 34, a main body 36, a tray cap 38, a card cover 40, a first clamping space 42, a second clamping space 44, a first restriction portion 46, a second restriction portion 48; a card tray plug-in device 300, a card holder 200, a signal terminal 210, a case 201, a fixing sheet 202, a top board 203, a side board 204, an elastic sheet 211, an elastic clip 212; and a terminal 102, a display unit 104, a shell 106.

DETAILED DESCRIPTION

Implementations of the present disclosure will be described in details hereafter. Embodiments of the implementations are shown in figures. Throughout the entire description, same or similar codes may indicate same or similar components, or components with same or similar functions. Implementations referring to the appended figures may be examples, and for the purposes of explaining the present disclosure, but not to limit the present disclosure.

In the description of the present disclosure, to be noted that, terms "center", "longitudinal", "lateral", "length", "width", "thickness", "upper", "lower", "front", "back", "left", "right", "vertical", "horizontal", "top", "bottom", "inner", "outer", "clockwise", "anti-clockwise" and the like expressions may indicate directions or position relations based on the figures, which are for the purposes of simplifying the description, but not to indicate or imply the apparatus or components have to be arranged in certain positions or engaged or operated along certain orientations. Therefore, the above expressions should not be interpreted as limiting the present disclosure. In addition, terms "first" and "second" may be for the purposes of description only, but not indicate or imply relative significance of the components, or imply a number of indicated technical features. Therefore, features expressed with "first" or "second" may suggest or imply inclusion of one or more of the features. In the description of the present disclosure, "a plurality" may indicate two or more than two, unless otherwise specified.

In the present disclosure, it should be noted, unless specified or limited, otherwise, terms "install", "connected", "coupled", "disposed", and the like, are used in a broad sense, and may include, for example, fixed connections, detachable connections, or integral connections; may also be mechanical or electrical connections; may also be direct connections or indirect connections via intervening structures; may also be inner communications of two elements, as can be understood by those skilled in the art depending on specific contexts.

In the present disclosure, unless specified or limited otherwise, a structure in which a first feature is "on" or "below" a second feature may encompass an embodiment in which the first feature is in a direct contact with the second feature, and may also encompass an embodiment in which the first feature and the second feature are not in a direct contact, but are contacted via an additional feature provided therebetween. Furthermore, expressions such as "a first feature is "on," "above," or "on top of a second feature" may encompass an embodiment in which the first feature is right or obliquely "on," "above," or "on top of" the second feature, or just that the first feature is at a height higher than that of the second feature; while expressions such as "a first feature "below," "under," or "on bottom of a second feature" may encompass an embodiment in which the first feature is right or obliquely "below," "under," or "on bottom of" the second feature, or just that the first feature is at a height lower than that of the second feature.

The following description provides various embodiments or examples for implementing various structures of the present disclosure. To simplify the description of the present disclosure, parts and settings of specific examples are described as follows. Certainly, they are only illustrative, and are not intended to limit the present disclosure. Further, reference numerals and reference letters may be repeated in different examples. This repetition is for purposes of simplicity and clarity and does not indicate a relationship of the various embodiments and/or the settings. Furthermore, the present disclosure provides specific examples of various processes and materials. However, a person skilled in the art may be aware of applications of other processes and/or other materials.

According to an aspect of the present disclosure, a card tray may be provided to include a first supporting portion; and a second supporting portion connected to the first supporting portion. The first supporting portion may be configured to support a first data card, the second supporting portion may be configured to support a second data card; and the first supporting portion and the second supporting portion may be provided on a same side of the card tray along a thickness direction of the card tray. The card tray may be provided with an electrical connection portion, and the first data card supported on the first supporting portion and the second data card supported on the second supporting portion electrically connect with a card holder of a terminal through the electrical connection portion.

In some embodiments, the first supporting portion and the second supporting portion may be placed in parallel on the same side of the card tray along the thickness direction.

In some embodiments, the first supporting portion and the second supporting portion may be configured in parallel along a direction of where the card tray plugs with the card holder.

In some embodiments, the first supporting portion may define a first receiving groove, the second supporting portion may define a second receiving groove, the first receiving groove being configured to receive the first data card, and the second receiving groove being configured to receive the second data card.

In some embodiments, first contact terminals may be provided on a bottom face of the first receiving groove; second contact terminals may be provided on a bottom face of the second receiving groove, the first contact terminals being configured to electrically contact the first data card, and the second contact terminals being configured to electrically contact the second data card; and the electrical connection portion may include an insertion section, which may have connection terminals mounted, the first contact terminals and the second contact terminals electrically connecting with the connection terminals.

In some embodiments, the insertion section may be provided at an end of the card tray along a direction of where the card tray plugs into the card holder.

In some embodiments, the first contact terminals and the second contact terminals may be elastic contact terminals.

In some embodiments, the first receiving groove may communicate with the second receiving groove.

In some embodiments, a side wall of the first receiving groove may define a first picking groove, which may communicate with the first receiving groove, and a side wall of the second receiving groove may define a second picking groove, which may communicate with the second receiving groove.

In some embodiments, the card tray may include a main body, which is substantially rectangular shaped; the first supporting portion and the second supporting portion may be arranged on the main body; the electrical connection portion may be configured at a lengthwise end of the main body; a tray cap may be provided at another lengthwise end of the main body, periphery of the tray cap protruding from the main body; and a card cover mounted on the main body, the card cover and the first supporting portion defining a first clamping space for clamping one of the data cards, the card cover and the second supporting portion defining a second clamping space for clamping the other one of the data cards.

According to another aspect of the present disclosure, a card tray plug-in device may be provided to include a card tray, wherein the card tray may include a base having a top surface and a bottom surface opposite to the top surface along a thickness direction of the base, the base defining a first recess and a second recess, the first and the second recesses recessing from the top surface to the bottom surface, wherein projections of the first recess and the second recess on the bottom surface may be unoverlapped; a first data card received in the first recess, a second data card received in the second recess; a second data card received in the second recess; first contact terminals received in the first recess and configured to contact with the first data card; second contact terminals received in the second recess and configured to contact with the second data card; and a card holder configured to receive the card tray and comprising signal terminals connected to the connection terminals.

In some embodiments, the signal terminals may include a plurality of elastic sheets configured in parallel to allow the signal terminals to elastically resist the electrical connection portion of the card tray.

In some embodiments, a first restriction portion may be provided on a side wall of the card tray, and a second restriction portion may be provided on the card holder, the first and the second restriction portions being engaged to restrict the card tray and the card holder to move with relative to each other.

In some embodiments, the first restriction portion may be a groove, the card holder may include an elastic clip configured along a direction of where the card tray plugs with the card holder; and the second restriction portion may be a protrusion formed on the elastic clip.

In some embodiments, the protrusion may be formed by bending the elastic clip.

According to still another aspect of the present disclosure, a terminal may be provided to include an enclosure having a chamber and defining a hole communicated with the chamber; a card holder received in the chamber; a card tray received in the chamber and capable of moving via the hole from a first state where at least part of the card tray may be out of the chamber to a second state where the card tray is received in the chamber, wherein the card tray may include a base having a top surface and a bottom surface opposite to the top surface, contact terminals mounted on the top surface of the base, connection terminals mounted on one end of the base and connecting with the contact terminals, and a cap mounted on the other end of the base and engaged in the hole of the enclosure; a first data card supported on the top surface of the base and connected to the contact terminals; and a second data card supported on the top surface of the base and connected to the contact terminals, wherein projections of the first and second data cards on the bottom surface of the base are totally separated.

In some embodiments, a tray cover may be engaged with the base of the card tray to define a first clamping space and a second clamping space, the first data card and the second data card being clamped tightly in the first clamping space and the second clamping space, respectively.

In some embodiments, the card holder may include signal terminals elastically connects with the connection terminals to transmit data between the data cards and the terminal.

In some embodiments, a first restriction portion may be provided on a side wall of the card tray, and a second restriction portion may be provided on the card holder, the first and the second restriction portions being engaged to restrict the card tray and the card holder to move with relative to each other.

In some embodiments, a direction of which the connection terminals connect with the signal terminals may be perpendicular to a direction of which the card holder and the card tray are received into the hole of the terminal.

Referring to FIG. 1, a card tray 100 of one embodiment of the present disclosure may include a first supporting portion 10 and a second supporting portion 12 connected to the first supporting portion 10. The first supporting portion 10 and the second supporting portion 12 may both be arranged for placing data cards 14. The first supporting portion 10 and the second supporting portion 12 may be arranged on a same side of the card tray 100 along a thickness direction of the card tray 100.

Figure 4:
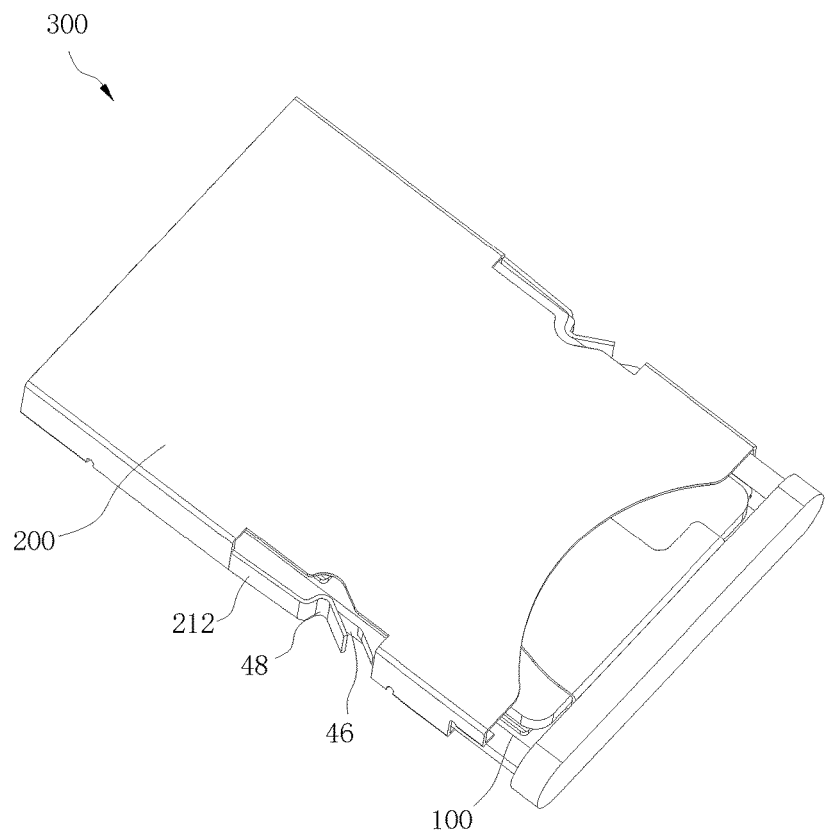
FIG. 4 is a perspective view of a card tray plug-in device provided by an embodiment of the present disclosure.
Figure 5:
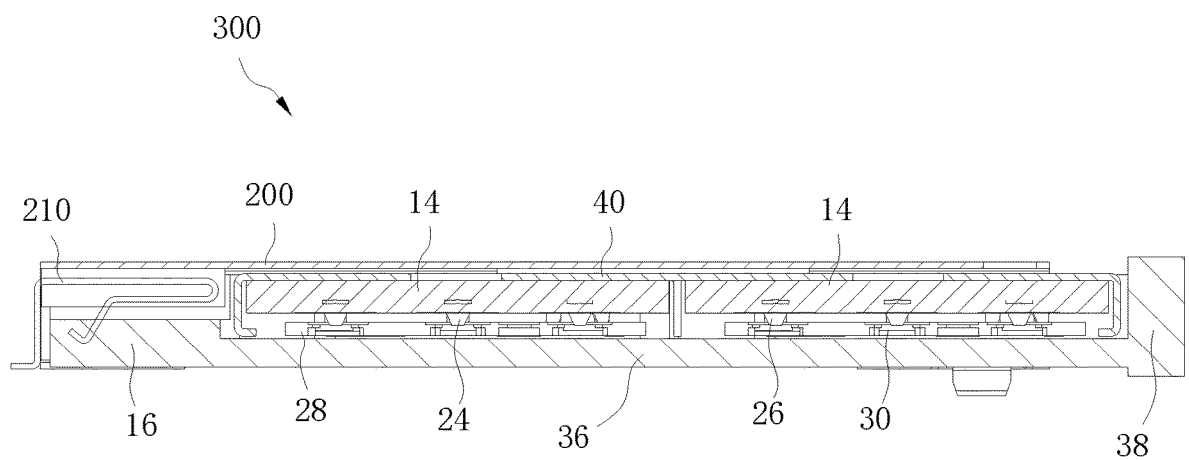
FIG. 5 is a cross-section view of a card tray plug-in device provided by an embodiment of the present disclosure.

The card tray 100 may include an electrical connection portion 15. The data card 14 placed on the first supporting portion 10 and/or the data card 14 placed on the second supporting portion 12 may be electrically connected to the card holder 200 through the electrical connection portion 15, as shown in FIGS. 4-5.

In the card tray 100 of one embodiment of the present embodiment, as the first supporting portion 10 and the second supporting portion 12 may be arranged on the same side of the card tray 100 along a thickness direction of the card tray 100, the two data cards 14 may be arranged on the same side, such that the card tray 100 with the data cards 14 placed may not be thickened, resulting in a slim terminal 102 and improving user experience. Furthermore, the electrical connection portion 15 configured with the card tray 100 may simplify the engagement between the card tray 100 and the card holder 200, and be conducive to manufacture the terminal 102.

Figure 2:
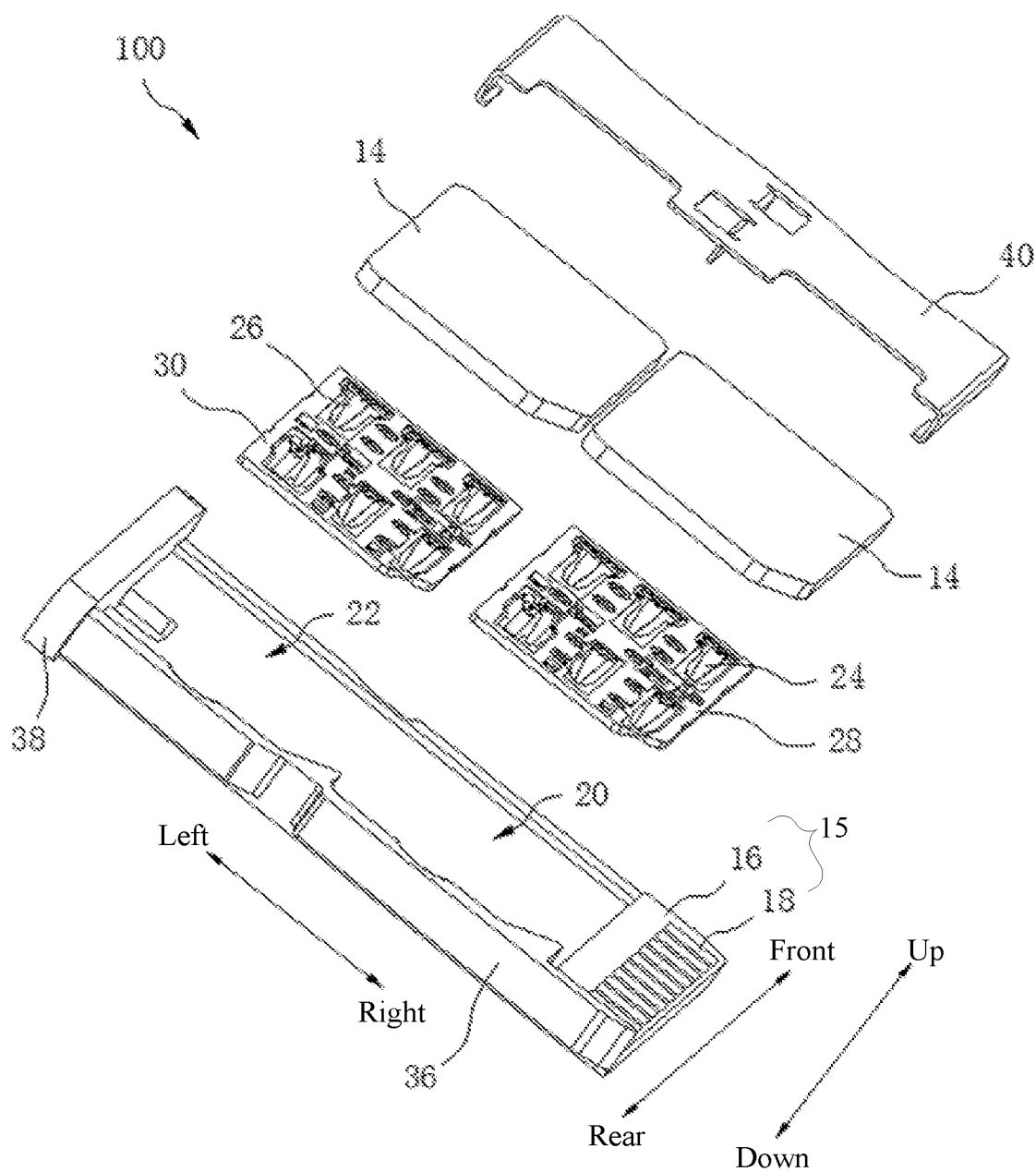
FIG. 2 is an explosive isometric view of a card tray provided by an embodiment of the present disclosure.

To be specific, the thickness direction of the card tray 100 is shown as an up-down direction in FIG. 2. According to the present embodiment, the first supporting portion 10 and the second supporting portion 12 may both be arranged on an upper side of the card tray 100. It should be understood that, in other embodiments, the first supporting portion 10 and the second supporting portion 12 may both be arranged on a down side of the card tray 100.

Further, in the present embodiment, the card tray 100 may be made of metals, such as stainless steel. In such a way, the card tray 100 may have great ductility and malleability, therefore, the card tray 100 may be even thinner and miniaturized.

To be noted that, the data card 14 placed on the first supporting portion 10 and/or the data card 14 placed on the second supporting portion 12 may be electrically connected to the card holder 200 of the terminal through the electrical connection portion 15. To be specific, the electrical connection between the data cards 14 and the card holder 200 may indicate following situations.

1. Between the data card 14 placed on the first supporting portion 10 and the data card 14 placed on the second supporting portion 12, the data card 14 placed on the first supporting portion 10 may electrically connect to the hard holder 200.

2. Alternatively, between the data card 14 placed on the first supporting portion 10 and the data card 14 placed on the second supporting portion 12, the data card 14 placed on the second supporting portion 12 may electrically connect to the hard holder 200.

3. Alternatively, between the data card 14 placed on the first supporting portion 10 and the data card 14 placed on the second supporting portion 12, the data card 14 placed on the first supporting portion 10 and the data card 14 placed on the second supporting portion 12 may both electrically connect to the hard holder 200.

The data card 14 may include, but not be limited to, a SIM car, a TF card, or an SD card. The data card 14 may transmit data with the terminal 102 through a connection terminal 18, such that the terminal 102 may read information in the data card 14 to achieve functions of corresponded applications or save data into the data card 14. For example, the terminal 102 may make phone calls and receive and send messages by reading information in the data card 14.

In some embodiments, the first supporting portion 10 and the second supporting portion 12 may be configured in parallel on a same side of the card tray 100 along the thickness direction.

In such a way, the parallel configuration of the first supporting portion 10 and the second supporting portion 12 may form a compact structure to miniaturize the card tray 100.

In the present embodiment, the first supporting portion 10 and the second supporting portion 12 may be configured in parallel along a direction of where the card tray 100 plugs with the card holder 200.

The direction of where the card tray 100 plugs with the card holder 200 is shown as a left-right direction in FIG. 2. To be specific, a direction of where the card tray 100 plugs into the card holder 200 may be a direction towards the right as shown in FIG. 2, and a direction of where the card tray 100 is unplugged from the card holder 200 may be a direction towards the left as shown in FIG. 2.

Therefore, the two data cards 14 may be configured in parallel along the direction of where the card tray 100 plugs with the card holder 200. To be specific, projections of the two data cards on a bottom surface of the card tray may be totally separated. In other embodiments, the two supporting portions (which may be the first supporting portion 10 and the second supporting portion 12) may be configured in parallel along a direction perpendicular to the direction of where the card tray 100 plugs with the card holder 200, which may be a front-rear direction as shown in FIG. 2.

Referring to FIG. 1 and FIG. 2, in some embodiments, the first supporting portion 10 may define a first receiving groove 20, and the second supporting portion 12 may define a second receiving groove 22. The first receiving groove 20 and the second receiving groove 22 may both be used to receive the data card 14.

In such a way, receiving the data card 14 in the receiving groove may restrict the position of the data card 14, such that the data card 14 may be disposed to a predefined position rapidly. Further, the thickness of the card tray 100 may be reduced compared with techniques in related art.

Shapes and sizes of the first receiving groove 20 and the second receiving groove 22 may fit with the shapes and the sizes of the data cards 14. For example, the shape of the first receiving groove 20 and the shape of the second receiving groove 22 may be the same as that of the data cards 14. The data card 14, such as a SIM card, a TF card, or an SD card, may be rectangular or polygonal. Therefore, the shape of the first receiving groove 20 and the shape of the second receiving groove 22 may be rectangular or polygonal. Further, to be understood that, the size of the first receiving groove 20 and the size of the second receiving groove 22 may be slightly larger than that of the data cards 14, such that the data cards 14 may be able to be placed within the receiving grooves.

In some embodiments, a bottom face of the first receiving groove 20 may be provided with first contact terminals 24, and a bottom face of the second receiving groove 22 may be applied with second contact terminals 26. The first contact terminals 24 and the second contact terminals 26 may both be configured to electrically connect with the data cards 14.

The electrical connection portion 15 may include an insertion section 16, and a connection terminal 18 may be provided on the insertion section 16 for electrically connecting to the card holder 200. The first contact terminal 24 and the second contact terminal 26 may both electrically connect with the connection terminals 18.

In such a way, the data cards 14 may electrically connect to the connection terminals 18 via the contact terminals, which simplifies the connection structure between the data cards 14 and the connection terminals 18. When the data card 14 is placed within the first receiving groove 20 and/or the second receiving groove 22, the electrical connection with the connection terminals 18 may be achieved.

In the present embodiment, the insertion section 16 may be connected with the first supporting portion 10. The connection terminals 18 are connecting fingers applied on the electrical connection portion 15. In other embodiments, the connection terminals 18 may be metal protruding points, protruding from a surface of the insertion section 16.

To be specific, the first contact terminals 24 and the second contact terminals 26 may connect with the connection terminals 18 through conductive lines, such that the first contact terminals 24 and the second contact terminals 26 may electrically connect with the connection terminals 18.

In the present embodiment, the electrical connection portion 15 may be configured on the card tray 100 at an end of the card tray 100 along the direction of where the card tray 100 inserts into the card holder 200.

That is, as the example shown in FIG. 2, the electrical connection portion 15 may be configured at a right end of the card tray 100 to allow an easy electrical contact and connection between the electrical connection portion 15 and the card holder 200.

Figure 3:
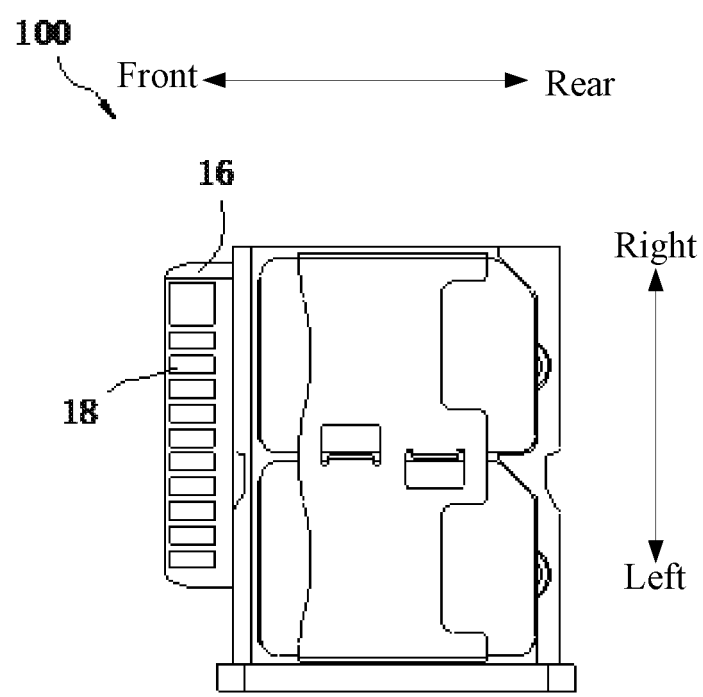
FIG. 3 is a top view of a card tray provided by an embodiment of the present disclosure.

In some embodiments, the electrical connection portion 15 may be provided at an end of the card tray 100 facing a first direction. The first direction may be perpendicular to the direction of where the card tray 100 plugs with the card holder 200 (shown in FIG. 4). To be specific, facing the first direction may be facing towards a front direction, and the direction of where the card tray 100 plugs with the card holder 200 may face towards a right direction, as shown in FIG. 3.

In some embodiments, the first contact terminals 24 and the second contact terminals 26 may both be elastic contact terminals. Therefore, the first contact terminals 24 and the second contact terminals 26 may respectively resist the data card 14 elastically, which may prevent poor contact between the contact terminals and the data cards.

Referring to FIG. 2, in some embodiments, the card tray 100 may include a first base 28 and a second base 30. The first base 28 may be applied on the bottom face of the first receiving groove 20. The second base 30 may be configured on the bottom face of the second receiving groove 22. The first contact terminals 24 may be applied on the first base 28, and the second contact terminals 26 may be provided on the second base 30.

In such a way, the first contact terminals 24 and the second contact terminals 26 may be formed on the first base 28 and the second base 30 respectively, allowing easy manufacture of the first contact terminals 24 and the second contact terminals 26.

To be specific, the first base 28 and the second base 30 are in forms of sheets. The first contact terminals 24 and the second contact terminals 26 may be formed from hollow structures of the first base 28 and the second base 30, respectively. In other words, the first contact terminals 24 and the first base 28 may be an integrated structure, and the second contact terminals 26 and the second base 30 may be an integrated structure.

The first base 28 and the second base 30 may be fixed on the bottom face of the first receiving groove 20 and the bottom face of the second receiving groove 22, respectively, by welding, such as laser welding.

In some embodiments, the first receiving groove 20 may communicate with the second receiving groove 22, such that the card tray 100 may have a simple structure and be manufactured easily.

Referring to FIG. 1, in some embodiments, a side wall of the first receiving groove 20 may define a first picking groove 32, and the first picking groove 32 may communicate with the first receiving groove 20. A side wall of the second receiving groove 22 may define a second picking groove 34, and the second picking groove 34 may communicate with the second receiving groove 22.

In such a way, fingers of a user may contact the data card 14 through the picking groove, such that the data cards 14 may be easily placed into or picked out of the receiving grooves.

In order to allow the user to install or uninstall the data card 14 easily, the first picking groove 32 and the second picking groove 34 may both be arced. In addition, the first picking groove 32 may be defined in the side wall of the first receiving groove 20 along a direction of placing the data card 14 into the first receiving groove 20, and the second picking groove 34 may be defined in the side wall of the second receiving groove 22 along a direction of placing the data card 14 into the second receiving groove 22.

For example, the data card 14 may be placed into the first receiving direction 20 or the second receiving groove 22 along the left-right direction. Therefore, the first picking groove 32 may be defined in the front side wall or the rear side wall of the first receiving groove 20, and the second picking groove 34 may be defined in the front side wall or the rear side wall of the second receiving groove 22.

Referring to FIG. 1 and FIG. 2, in some embodiments, the card tray 100 may include a main body 36, which has a configuration of cuboid. The main body 36 has the first supporting portion 10 and the second supporting portion 12. The electrical connection portion 15 may be configured at an end of the main body 36 along the length direction, which may be the left-right direction as shown in the FIG. 1 and FIG. 2, and a tray cap 38 may be provided at the other end of the main body along the length direction. Periphery of the tray cap 38 may be protruded from the main body 36.

In such a way, the tray cap 38 may allow the user to reach the card tray 100 easily, such that the card tray 100 may be placed into the terminal 102 easily. After placing the card tray 100 into the terminal 102, the tray cap 38 may be tightly engaged with a recess of the terminal 102, such that an outer face of the tray cap 38 may align with a side face of the terminal 102, forming a smooth surface and providing a better appearance.

A shape of the tray cap 38 may be designed according to practical situations, and may be squared, circular, elliptical, oval-shaped, or the like.

In some embodiments, the card tray 100 may include a card cover 40 mounted on the main body 36. The card cover 40 and the first supporting portion 10 may together define a first clamping space 42 to clamp one data card 14. The card cover 40 and the second supporting portion 12 may together define a second clamping space 44 to clamp the other data card 14.

In such a way, the first clamping space 42 and the second clamping space 44 may prevent the data cards 14 from falling off from the card tray 100, availing the data cards 14 being carried by the card tray 100, inserted into the terminal 102.

Referring to FIG. 3 and FIG. 4, the card tray plug-in device 300 of the present embodiment may include the card tray 100 and the card holder 200 as described in any of the above-mentioned embodiments. The card tray 100 may be inserted into the card holder 200, the card holder 200 may be configured with signal terminals 210, and the signal terminal 210 may electrically connect with the electrical connection portion 15.

In the card tray plug-in device 300 provided by the present embodiment, as the first supporting portion 10 and the second supporting portion 12 may be configured on the same side of the card tray 100 along the thickness direction, the card tray 100 with the data cards 14 placed may be not be thickened, resulting in a slim terminal 102, improving user experience. In addition, the electrical connection portion 15 of the card tray 100 may simplify the engagement structure between the card tray 100 and the card holder 200, resulting in easy manufacture of the terminal 102.

Further, the card tray 100 may engage with the card holder 200, such that the card tray 100 may be easily placed into the terminal 102. To be specific, an end of the signal terminal 210 may contact with the connection terminal 18 of the insertion section 16, and the other end may connect with a circuit board in the terminal 102, such that the data cards 14 may achieve a data transmission function with the terminal 102 through the card tray plug-in device 300.

Figure 6:
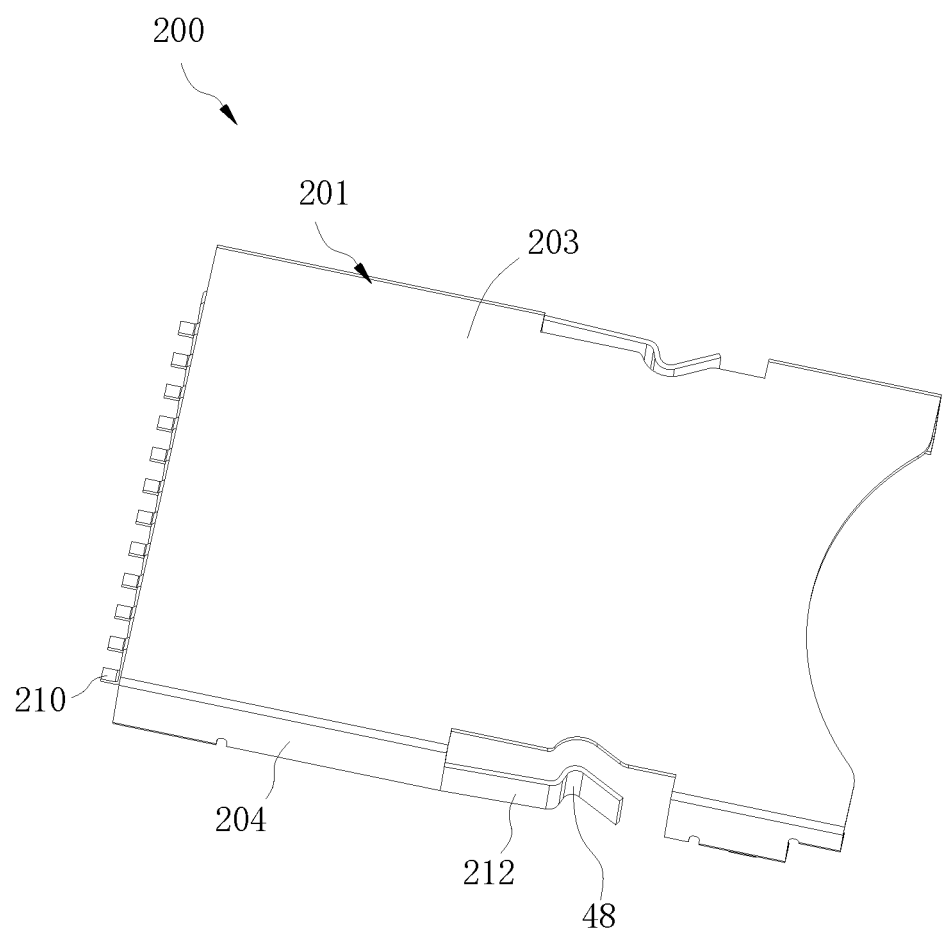
FIG. 6 is a perspective view of a card holder provided by an embodiment of the present disclosure.
Figure 7:
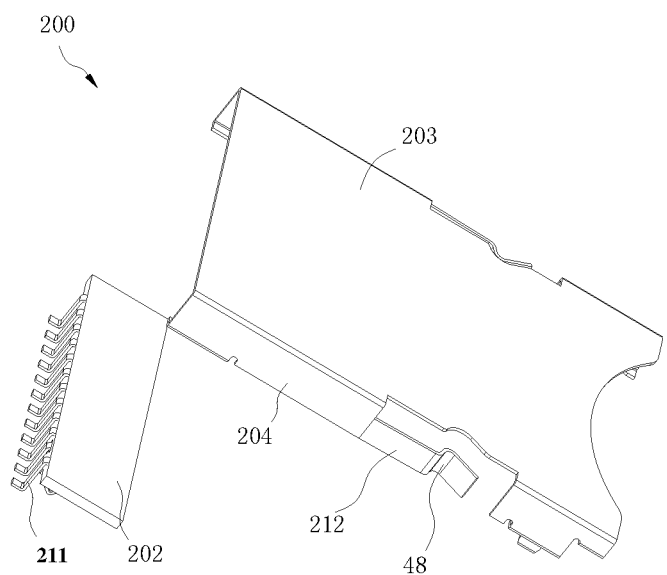
FIG. 7 is an exploded isometric view of a card holder provided by an embodiment of the present disclosure.
Figure 8:
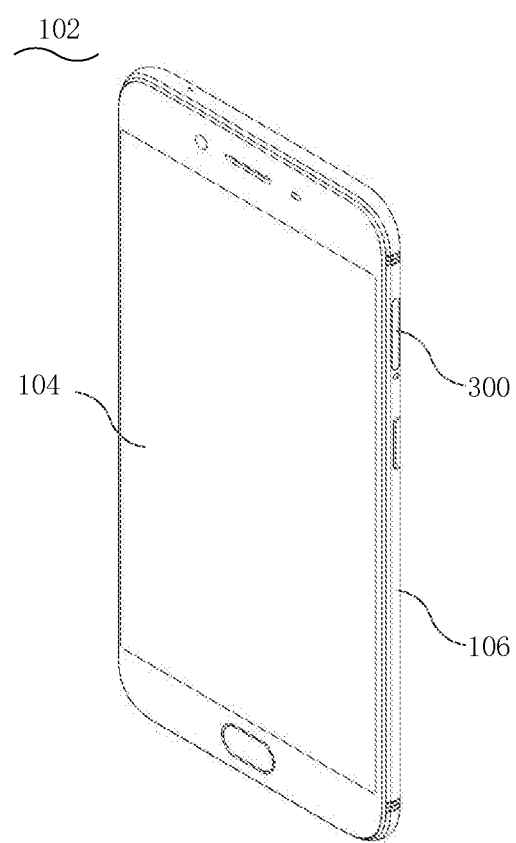
FIG. 8 is a perspective view of a terminal provided by an embodiment of the present disclosure.

Referring to FIG. 5 to FIG. 7, to be specific, in the present embodiment, the card holder 200 may include a case 201 and a fixing sheet 202. The case 201 may be frame shaped and include a top board 203 and side boards 204 extending downwardly from two sides edges of the top board 203. The card tray 100 may be received in a receiving space defined by the top board 203 and the side board 204.

The fixing sheet 202 may be fixed on the top board 203 and placed in the receiving space. The signal terminals 210 may be mounted on the fixing sheet 202. In other words, the signal terminals 210 may be fixed on the case 201 through the fixing sheet 202.

In some embodiments, the signal terminals 210 may include a plurality of elastic sheets 211 arranged in parallel, allowing the signal terminal 210 to elastically resist the electrical connection portion 15.

In such a way, the plurality of elastic sheets 211 may resist the connection terminal 18 to allow proper contact between the signal terminals 210 and the connection terminals 18, such that poor communications between the data cards 14 and the terminal 102 caused by the poor contact may be avoided.

In some embodiments, a first restriction portion 46 may be provided on a side wall of the card tray 100, and a second restriction portion 48 may be provided on the card holder 200. The first restriction portion 46 and the second restriction portion 48 may be connectively engaged to restrict the card tray 100 and the card holder 200 moving in relative to each other.

The connective engagement between the first restriction portion 46 and the second restriction portion 48 may prevent the card tray 100 and the card holder 200 from moving apart from each other, such that the electrical connection between the card tray 100 and the card holder 200 may not be interrupted.

In some embodiments, the first restriction portion 46 may be a groove, the card holder 200 may include an elastic clip 212 configured along a direction of where the card tray 100 plugs with the card holder 200. The second restriction portion 48 may be a protrusion formed on the elastic clip 212.

In such a way, the first restriction portion 46 and the second restriction portion 48 may have a simple structure, allowing easy manufacture of the card tray plug-in device 300. To be specific, the elastic clip 212 may be provided on the side board 204.

In addition, in the present embodiment, the protrusion of the elastic clip 212 may be formed by bending the elastic clip 212.

Referring to FIG. 7, the terminal 102 of the present embodiment may include the card tray plug-in device 300 as described in any one of the above-mentioned embodiments.

In the terminal 102 provided by the present embodiment, as the first supporting portion 10 and the second supporting portion 12 may be configured on the same side of the card tray 100 along the thickness direction, the card tray 100 with the data card 14 placed may not be thickened, resulting in a slim terminal 102, improving user experience. In addition, the electrical connection portion 15 of the card tray 100 may simplify the engaged structure between the card tray 100 and the card holder 200, allowing easy manufacture of the terminal 102.

In the present embodiment of the disclosure, the terminal 102 may be any device, which can acquire external data and process the acquired data. Alternatively, the terminal 102 may be any device, which may have a built-in battery and can acquire external electricity for charging. Such terminals may be a mobile phone, a tablet computer, a calculating device, an information display device, or the like.

A mobile phone may be used as an example to illustrate the terminal 102 provided by the present disclosure. In the present embodiment, the mobile phone may include a radio-frequency circuit, a non-transitory memory, an input unit, wireless fidelity (WiFi) module, a display unit 104, an external shell 106, a sensor, an audio frequency circuit, a processor, a projector unit, an image pickup unit, a battery, a card tray, and other components, wherein the card tray may be configured on a side of the mobile phone.

The radio-frequency circuit may be configured to receive and send signals when receiving and sending messages or calling. To be specific, after receiving downlink information sent from the base station, the information may be transmitted to the processor for processing. In addition, uplink information of the mobile phone may be sent to the base station. Generally, the radio-frequency circuit may include but not be limited to an antenna, at least an amplifier, a transducer, a coupler, a low-noise amplifier, a diplexer, and the so on. Further, the radio-frequency circuit may communicate with other devices through wireless communication and networks. The above-mentioned wireless communication may use any communication standard or protocol, which may include, but not be limited to, the global system for mobile communication (GSM), the general packet radio service (GPRS), the code division multiple access (CDMA), the wideband code division multiple access (WCDMA), the long term evolution (LTE), emails, the short messaging service (SMS), or the like.

The non-transitory memory may be configured to store software programs and modules, and the processor may run the software programs and modules stored in the non-transitory memory to execute various functional applications of the mobile phone and perform data processing. The non-transitory memory may mainly include a program storage area and a data storage area. The program storage area may store an operating system, at least an application necessary for functioning (such as for audio playing, image displaying, or the like), or the like. The data storage area may store data (such as audio data, a phonebook, and the like), which is generated while using the mobile phone. Further, the non-transitory memory may include high-speed random access memory and non-volatile memory, such as at least one magnetic disk storage device, a flash memory device, or other volatile solid storage devices.

The input unit may be configured to receive input digits or character information, and generate key signals which are relative to user settings of the mobile phone and for functional controls. To be specific, the input unit may include a control panel and other input devices. A touch panel, which is also called a touch screen, may collect touch operations performed by a user on or near the control panel (for example, operations which are performed by user fingers, a stylus, or any other workable objects or their add-ons on the touch panel or near the touch panel), and drive a corresponded connection device based on a predefined program. Alternatively, the touch panel may include a touch detection device and a touch controller. The touch detection device may detect a location of where the user touches the panel, detect signals generated by the operation of touching, and transmit the signals to the touch controller. The touch controller may receive the touching information sent from the touch detection device, transfer the information into a coordinate of the touch point which may be transmitted to the processor, and then receive and execute instructions sent from the processor. Further, the touch panel may be a resistive touch panel, a capacitive touch panel, an infrared touch panel, a surface acoustic wave touch panel or the like. Besides the touch panel, the input unit may further include other input devices. To be specific, the other input devices may include, but not be limited to, at least one of a physical keyboard, functional buttons (such as a button controlling volume, a switch button, or the like), a trackball, a mouse, an operating rod and the like.

The display unit 104 may be configured to display information input by the user or provided to the user and various menus of the mobile phone. The display unit 104 may include a display panel, which may be a liquid crystal display (LCD) display unit 104 or a display panel configured with organic light-emitting diode (OLED). Further, the touch panel may cover the display panel. After the touch panel detects the touching operation performed on or near the touch panel, the touching information may be transmitted to the processor to determine a type of the touching operation, and the processor may provide a corresponded visual output based on the type of the touching operation.

A location of the visual output recognized by human eyes may be defined as a "display region" for further description. The touch panel and the display panel may be two independent components to achieve the input and output functions of the mobile phone separately, or may be integrated into one to achieve the input and output functions.

In addition, the mobile phone may include at least one sensor, such as a gesture sensor, a light sensor, and other sensors.

To be specific, the gesture sensor may also be called as a motion sensor, and a gravity sensor may be listed as a type of the motion sensor. The gravity sensor may use elastic-sensitive elements to produce a cantilever displacer and an energy storage spring, wherein the energy storage spring may drive an electrical contact, such that transformation of the gravity into an electrical signal may be performed.

An accelerometer sensor may be listed as another type of the motion sensor. The accelerometer may detect the magnitude of acceleration along all directions (usually along the three axes). When the mobile phone is at rest, the magnitude and the direction of the gravity may be detected, such information may be used by applications which recognize mobile phone gestures (such as switching between a horizontal screen and a vertical screen, relevant games, and magnetometer gesture calibration), and to perform functions of recognizing vibration (such as a pedometer and knocking) and the like.

In the embodiments of the present disclosure, the above listed motion sensors may be used as an element acquiring "gesture parameters", but the motion sensors should not be limited hereto, other sensors that can acquire "gesture parameters" should also be included in the scope of the present disclosure, such as a gyro and the like. Also, operation principles and procedures of data processing of the gyro may be similar to related arts, which will not be described in details herein.

In addition, in the embodiments of the present disclosure, the sensor may further be configured with a barometer, a hygrometer, a thermometer, an infrared sensor and other sensors, which will not be described in details herein.

The light sensor may include an environmental light sensor and a proximity sensor. The environmental light sensor may adjust brightness of the display panel according to brightness of the ambient light, and the proximity sensor may switch off the display panel and/or a backlight when the mobile phone moved close to ears.

The audio frequency circuit, the loudspeaker, and a microphone may provide an audio interface between the user and the mobile phone. The audio frequency circuit may transmit electrical signals, which are transferred from audio frequency data, to the loudspeaker, and the loudspeaker may transfer the electrical signals into sounds for output. On the other hand, the microphone may transfer collected acoustic signals into electrical signals, the audio frequency circuit may receive the electrical signals and transfer the signals into audio frequency data, the audio frequency data may be output to the processor for processing, and the processed data may be sent to another mobile phone through the radio frequency circuit or output to the non-transitory memory for further processing.

WiFi is a technology of wireless transmission in short distance. Through the WiFi module, the mobile phone may avail the user to receive and send emails, browse websites, access streaming media and so one. The WiFi may provide broadband internet access for the user.

The processor may be a control center of the mobile phone, using various interfaces and lines to connect all different parts of the mobile phone. By running or executing software programs and/or modules stored in the non-transitory memory and invoking data stored in the non-transitory memory, the processor may execute various functions of the mobile phone and process data to overall monitor the mobile phone. The processor may include one or more processing units. Preferably, the processor may integrate an application processor and a modem processor. The application processor may process the operating system, a user interface and applications. The modem processor may process wireless communications.

It should be understood that, the above mentioned modem processor may not be integrated into the processor.

In the description of the present disclosure, terms "an implementation", "some implementations", "example implementation", "an embodiment", "a specific embodiment", or "some embodiments" refer to at least an implementation or embodiment, which may combine specific features, structures, materials or characteristics provided by the present disclosure. In the present specification, indicative expressions of the above terms may not refer to a same implementation or a same embodiment. Further, the described specific features, structures, materials, or characteristics may be combined in any form and shown in any one or more implementations or embodiments.

Although implementations of the present disclosure have been illustrated and described, ordinary skilled in the art should understand that, without departing from the principles and spirits of the present disclosure, the implementations may be changed, modified, replaced, and transformed. The scope of the present disclosure should be limited by claims and their equivalence.

What is claimed is:

1. A card tray, comprising:
a first supporting portion; and
a second supporting portion connected to the first supporting portion, wherein
the first supporting portion is configured to support a first data card;
the second supporting portion is configured to support a second data card; and
the first supporting portion and the second supporting portion are provided on a same side of the card tray along a thickness direction of the card tray, wherein
the card tray is provided with an electrical connection portion;
the electrical connection portion is arranged at an end of the card tray; and
the first data card supported on the first supporting portion and the second data card supported on the second supporting portion electrically connect with a card holder of a terminal through the electrical connection portion.

2. The card tray according to claim 1, wherein the first supporting portion and the second supporting portion are placed in parallel on the same side of the card tray along the thickness direction.

3. The card tray according to claim 2, wherein the first supporting portion and the second supporting portion are configured in parallel along a direction of where the card tray plugs into the card holder.

4. The card tray according to claim 1, wherein the first supporting portion defines a first receiving groove, the second supporting portion defines a second receiving groove, the first receiving groove being configured to receive the first data card, and the second receiving groove being configured to receive the second data card; and
the electrical connection portion is arranged on and protruded from at least one of a side wall of the first receiving groove and a side wall of the second receiving groove, and is extended perpendicular to the thickness direction of the card tray and away from the first receiving groove and the second receiving groove.

5. The card tray according to claim 4, wherein
first contact terminals are provided on a bottom face of the first receiving groove;
second contact terminals are provided on a bottom face of the second receiving groove, the first contact terminals being configured to electrically contact the first data card, and the second contact terminals being configured to electrically contact the second data card; and
the electrical connection portion comprises an insertion section, which has connection terminals mounted, the first contact terminals and the second contact terminals electrically connecting with the connection terminals.

6. The card tray according to claim 5, wherein the insertion section is provided at an end of the card tray along a direction of where the card tray plugs into the card holder.

7. The card tray according to claim 5, wherein the first contact terminals and the second contact terminals are elastic contact terminals.

8. The card tray according to claim 4, wherein the first receiving groove communicates with the second receiving groove.

9. The card tray according to claim 4, wherein the side wall of the first receiving groove defines a first picking groove, which communicates with the first receiving groove, and the side wall of the second receiving groove defines a second picking groove, which communicates with the second receiving groove.

10. The card tray according to claim 1, wherein
the card tray comprises a main body, which is substantially rectangular shaped;
the first supporting portion and the second supporting portion are arranged on the main body;
the electrical connection portion is configured at a lengthwise end of the main body;
a tray cap is provided at another lengthwise end of the main body, periphery of the tray cap protruding from the main body; and
a card cover mounted on the main body, the card cover and the first supporting portion defining a first clamping space for clamping one of the data cards, the card cover and the second supporting portion defining a second clamping space for clamping the other one of the data cards.

11. A card tray plug-in device, comprising:
a card tray, comprising:
    a base having a top surface, a bottom surface opposite to the top surface along a thickness direction of the base, and a side surface connecting to the top surface and bottom surface, the base defining a first recess and a second recess, the first and the second recesses recessing from the top surface to the bottom surface, wherein projections of the first recess and the second recess on the bottom surface are unoverlapped;
    a first data card received in the first recess;
    a second data card received in the second recess;
    first contact terminals received in the first recess and configured to contact with the first data card;
    second contact terminals received in the second recess and configured to contact with the second data card; and
    an electrical connection portion, protruded from the side surface of the card tray, and disposed out of the first recess and the second recess; and
a card holder configured to receive the card tray and comprising signal terminals connected to the first data card and the second data card through the electrical connection portion.

12. The card tray plug-in device according to claim 11, wherein the signal terminals comprise a plurality of elastic sheets configured in parallel to allow the signal terminals to elastically resist the electrical connection portion of the card tray.

13. The card tray plug-in device according to claim 11, wherein a first restriction portion is provided on another side surface of the card tray, and a second restriction portion is provided on the card holder, the first and the second restriction portions being engaged to restrict the card tray and the card holder from moving relative to each other.

14. The card tray plug-in device according to claim 13, wherein the first restriction portion is a groove, the card holder comprises an elastic clip configured along a direction of where the card tray plugs with the card holder; and the second restriction portion is a protrusion formed on the elastic clip.

15. The card tray plug-in device according to claim 14, wherein the protrusion is formed by bending the elastic clip.

16. A terminal, comprising:
an enclosure having a chamber and defining a hole communicated with the chamber;
a card holder received in the chamber;
a card tray received in the chamber and capable of moving via the hole from a first state where at least part of the card tray is out of the chamber to a second state where the card tray is received in the chamber, the card tray comprising:
    a base having a top surface and a bottom surface opposite to the top surface;
    contact terminals mounted on the top surface of the base;
    connection terminals mounted on one end of the base and connecting with the contact terminals; and
    a cap mounted on the other end of the base and engaged in the hole of the enclosure;
a first data card supported on the top surface of the base and connected to the contact terminals; and
a second data card supported on the top surface of the base and connected to the contact terminals, wherein projections of the first and second data cards on the bottom surface of the base are totally separated.

17. The terminal according to claim 16, wherein a tray cover is engaged with the base of the card tray to define a first clamping space and a second clamping space, the first data card and the second data card being clamped tightly in the first clamping space and the second clamping space, respectively.

18. The terminal according to claim 16, wherein the card holder comprises signal terminals elastically connects with the connection terminals to transmit data between the data cards and the terminal;
the bottom surface and the top surface are arranged along a thickness direction of the base; and the end having the connection terminals mounted are extended away from the first data card and the second data card, and are extended perpendicular to the thickness direction.

19. The terminal according to claim 16, wherein a first restriction portion is provided on a side wall of the card tray, and a second restriction portion is provided on the card holder, the first and the second restriction portions being engaged to restrict the card tray and the card holder from moving relative to each other.

20. The terminal according to claim 18, wherein a direction of which the connection terminals connect with the signal terminals is perpendicular to a direction of which the card holder and the card tray are received into the hole of the terminal.

* * * * *